US012624722B2

(12) United States Patent
Weiss

(10) Patent No.: US 12,624,722 B2
(45) Date of Patent: May 12, 2026

(54) SPACER NUT

(71) Applicant: John Weiss, San Francisco, CA (US)

(72) Inventor: John Weiss, San Francisco, CA (US)

(73) Assignee: The Boom, San Francisco, CA (US)

( * ) Notice: Subject to any disclaimer, the term of this patent is extended or adjusted under 35 U.S.C. 154(b) by 516 days.

(21) Appl. No.: 18/463,820

(22) Filed: Sep. 8, 2023

(65) Prior Publication Data

US 2024/0084840 A1     Mar. 14, 2024

Related U.S. Application Data

(60) Provisional application No. 63/374,948, filed on Sep. 8, 2022.

(51) Int. Cl.
*F16B 37/04*     (2006.01)
*H05K 7/14*     (2006.01)

(52) U.S. Cl.
CPC ......... *F16B 37/041* (2013.01); *H05K 7/1407* (2013.01)

(58) Field of Classification Search
CPC .. F16B 37/041; H05K 7/1407; H01M 10/658; H01M 50/209; H01M 50/264; H01M 50/284; H01M 50/291
See application file for complete search history.

(56) References Cited

U.S. PATENT DOCUMENTS

| | | | | | |
|---|---|---|---|---|---|
| 3,664,877 | A | * | 5/1972 | Shaw | H01M 50/209 |
| | | | | | 429/100 |
| 3,846,179 | A | * | 11/1974 | Shaw | H01M 50/204 |
| | | | | | 429/99 |
| 2009/0155680 | A1 | * | 6/2009 | Maguire | H01M 10/482 |
| | | | | | 429/158 |
| 2012/0028099 | A1 | * | 2/2012 | Aoki | H01M 10/643 |
| | | | | | 429/120 |
| 2018/0114960 | A1 | * | 4/2018 | Sato | H01M 50/209 |
| 2020/0373529 | A1 | * | 11/2020 | Popovski | H01M 50/264 |
| 2021/0151815 | A1 | * | 5/2021 | Milobar | H01M 50/264 |
| 2021/0151816 | A1 | * | 5/2021 | Shayan | H01M 10/658 |
| 2022/0271383 | A1 | * | 8/2022 | Akutsu | H01M 50/264 |
| 2024/0084840 | A1 | * | 3/2024 | Weiss | H01M 50/291 |

* cited by examiner

*Primary Examiner* — Kristina R Fulton
*Assistant Examiner* — Brian Paul Fournet, II
(74) *Attorney, Agent, or Firm* — Akerman LLP

(57) ABSTRACT

Disclosed embodiments include spacer nuts for use with battery packs and configurations thereof.

9 Claims, 5 Drawing Sheets

(Side View)     (Top View)

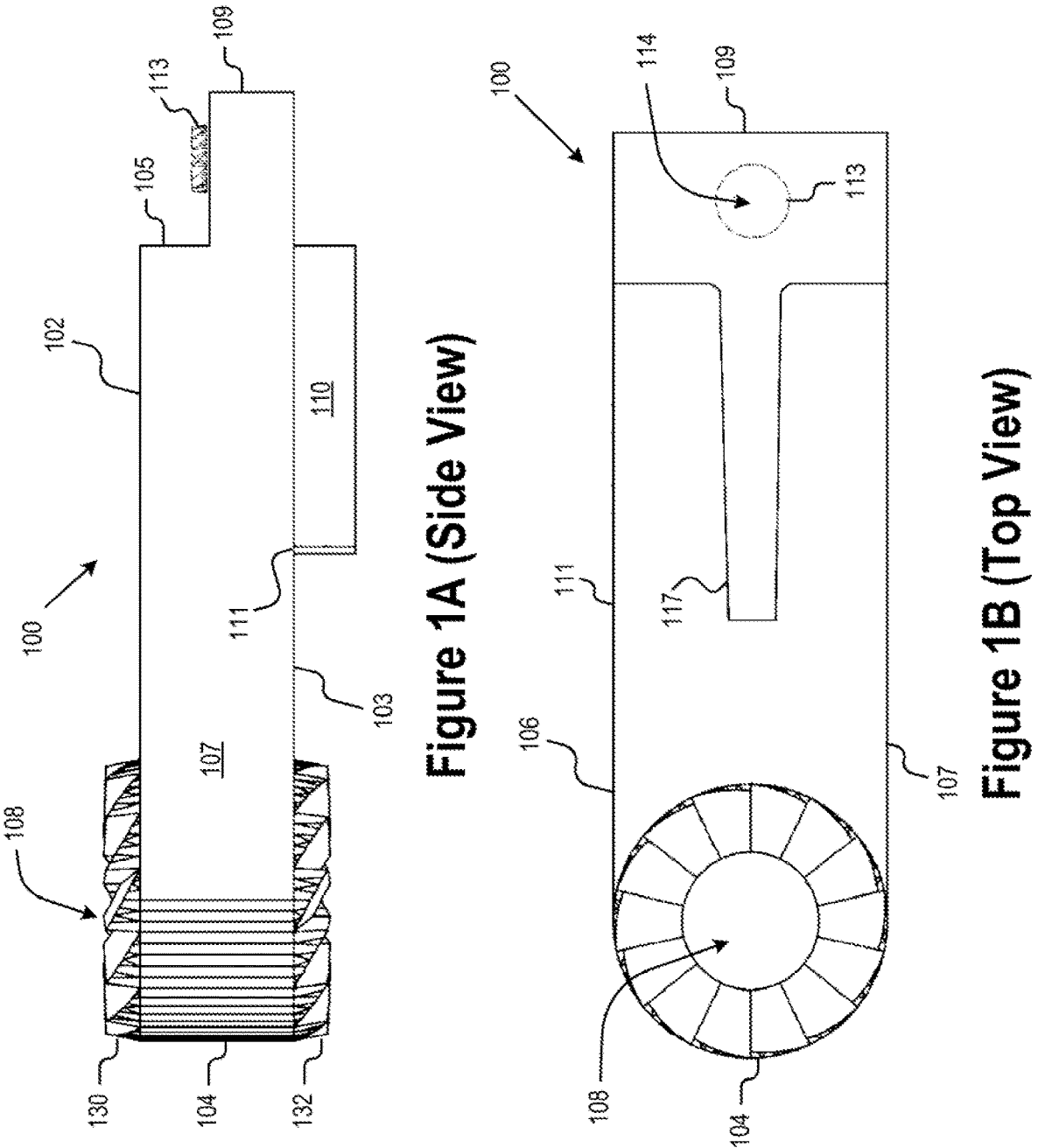
Figure 1A (Side View)
Figure 1B (Top View)

Figure 1C (Battery Spacer)

(Top View)

(Side View)

(End View)

SPACER NUT

CROSS-REFERENCE TO RELATED APPLICATIONS

This application claims priority to provisional application U.S. Ser. No. 63/374,948 titled "Spacer Nut," filed on Sep. 8, 2022. The entire contents of U.S. provisional application Ser. No. 63/374,948 are incorporated herein by reference.

FIELD OF THE DISCLOSURE

The present disclosure relates generally to hardware for mounting battery packs.

SUMMARY

Professional and hobbyist electronic engineering often requires custom-built battery packs. Such packs are widely used for industrial backup power supplies, product prototyping, power-walls, electronic bicycles and scooters, robots, and RC cars and planes.

There are two types of commonly used rechargeable lithium cells—18650 cells and 26650 cells. These cells are typically combined into multi-cell battery packs, in series or parallel configuration, to gain higher voltage and/or higher current.

In order to build these packs, some embodiments disclosed herein employ battery spacer nuts (sometimes referred to herein as "spacer nuts") and battery spacers that accommodate 26650 or 18650 cells. The spacer nuts and battery spacers include dovetail pins and dovetail receiving slots that enable the spacer nuts and the battery spacers to be joined together in different configurations, including but not limited to the configurations shown and described herein.

In some battery pack configurations, it is desirable to include associated electronic circuitry to be attached to banks of cells, or to individual cells. Some embodiments disclosed herein are configured to enable attachment of circuit boards or other components to battery pack infrastructure constructed from the disclosed battery spacer nuts and battery spacers.

BRIEF DESCRIPTION OF THE DRAWINGS

Features, aspects, and advantages of the presently disclosed technology may be better understood with regard to the following description, appended claims, and accompanying drawings, as listed below. A person skilled in the relevant art will understand that the features shown in the drawings are for purposes of illustrations, and variations, including different and/or additional features and arrangements thereof, are possible. Any dimensions illustrated in the accompanying figures are for illustration purposes only and may or may not represent actual or preferred dimensions. Where applicable, some or all features may not be illustrated to assist in the description of underlying features.

FIG. 1A is a side view of a single spacer nut configured in accordance with aspects of some embodiments.

FIG. 1B is a top view of a single spacer nut according to some embodiments.

FIG. 1C is a perspective view of a single battery spacer according to some embodiments.

Figure 2A:
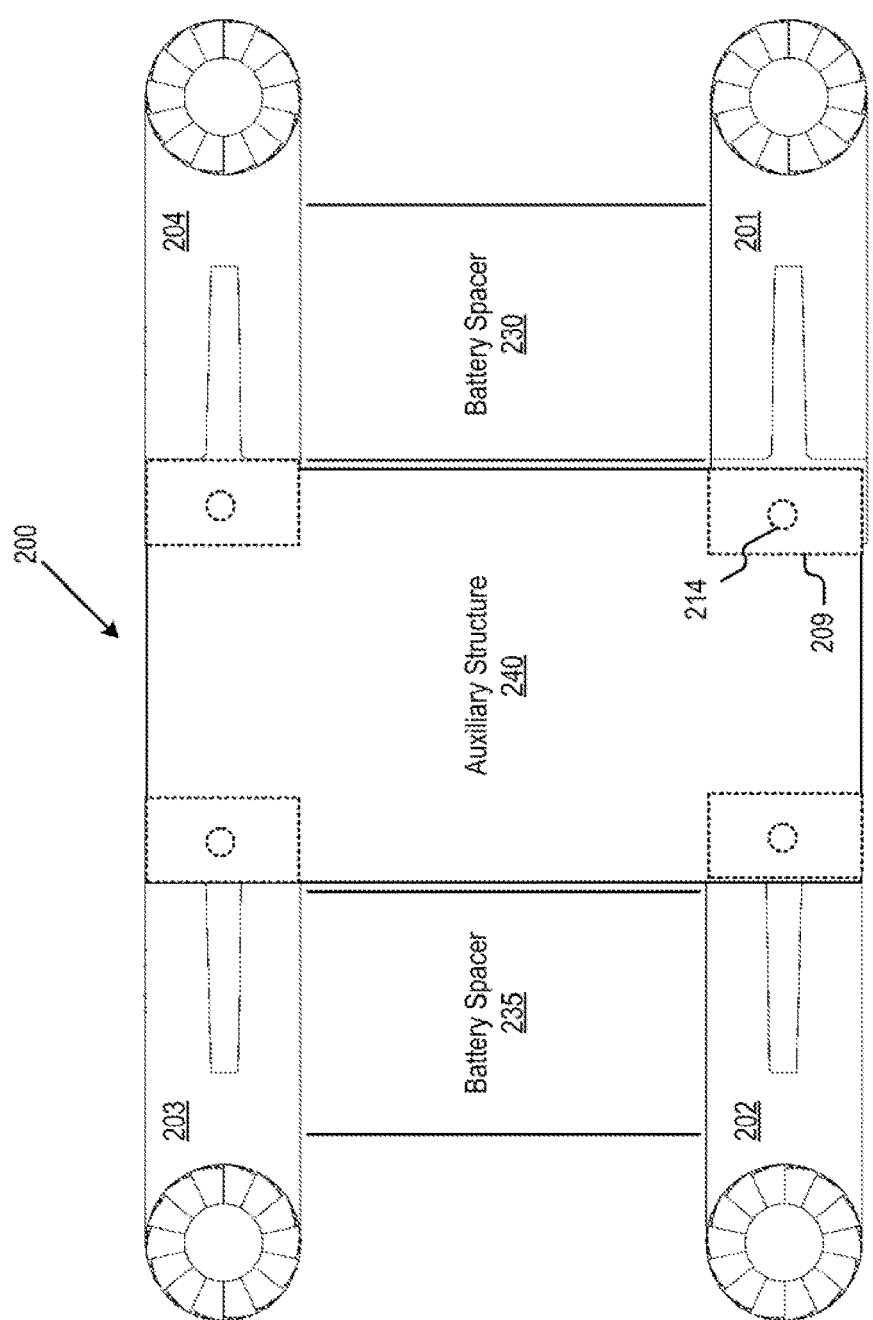
FIG. 2A is a top view of a set of four spacer nuts and two battery spacers arranged in a configuration to accommodate an auxiliary structure according to some embodiments.

The drawings are for the purpose of illustrating example embodiments, but those of ordinary skill in the art will understand that the technology disclosed herein is not limited to the arrangements and/or instrumentality shown in the drawings.

DETAILED DESCRIPTION OF THE DRAWINGS

Reference will now be made to the drawings wherein like numerals refer to like parts throughout.

FIG. 1A is a side view of a single spacer nut configured in accordance with aspects of some embodiments. In one embodiment, the spacer nut 100 is formed from a PA 12 (nylon) Black material or similar suitable material.

In some embodiments, spacer nut 100 comprises a top surface 102 along a longitudinal axis of the spacer nut 100 and a bottom surface 103 opposite the top surface 102 along the longitudinal axis of the spacer nut 100.

The spacer nut 100 further comprises a front end 104 along a lateral axis of the spacer nut 100 and a rear end 105 opposite the front end 104 along the lateral axis of the spacer nut 100.

The spacer nut 100 also has an opening 108 extending through the spacer nut 100 from the top surface 102 of the spacer nut 100 to the bottom surface 103 of the spacer nut 100 near the front end 104 of the spacer nut 100. The opening 108 accommodates bolts of various common bolt sizes that can be made from a variety of material(s). In some embodiments, non-conductive vinyl bolts or metal bolts, in common sizes #8 and #10, can be accommodated by the opening 108. In operation, and as shown in further detail in FIGS. 2B-C, the bolts can be used to build battery pack configurations that include several spacer nuts and battery spacers, including battery pack configurations that accommodate one or more auxiliary structures. The auxiliary structure(s) may be composed of metal, plastic, and/or wood or any other suitable material.

The region surrounding the opening 108 on the top surface 102 further comprises a first raised serrated structure 130 configured to receive a corresponding structure of a common washer or lock washer component. The region surrounding the opening 108 on the bottom surface 103 of the spacer nut 100 comprises a second raised serrated structure 132 configured to receive a corresponding washer component.

The example spacer nut embodiment shown in FIG. 1A also includes a dovetail pin 110 protruding from the bottom surface 103 of the spacer nut 100. The dovetail pin 110 extends from approximately a midpoint 111 of the bottom surface 103 of the spacer nut 100 to approximately the rear end 105 of the spacer nut 100. The dovetail pin 110 is configured to couple the spacer nut 100 to a corresponding dovetail receiving slot on the battery spacer to form a dovetail joint between the spacer nut 100 and the battery spacer.

In an alternative embodiment, the spacer nut 100 includes (i) a top surface 102 along a longitudinal axis of the spacer nut 100, (ii) a bottom surface 103 opposite the top surface 102 along the longitudinal axis of the spacer nut 100, (iii) a front end 104 along a lateral axis of the spacer nut 100, (iv) a rear end 105 opposite the front end 104 along the lateral axis of the spacer nut 100, (v) a first side 106 and a second side 107 opposite the first side 106 along the vertical axis of the spacer nut 100, (vi) an opening 108 extending from the top surface 102 to the bottom surface 103 near the front end 104 of the spacer nut 100, (vii) an attaching member 109 protruding from the rear end 105 of the spacer nut 100 and configured for coupling the spacer nut 100 to an auxiliary structure, and (viii) a dovetail pin 110 protruding from the bottom surface 103 of the spacer nut 100 and extending from approximately a midpoint 111 of the bottom surface 103 of the spacer nut 100 to approximately the rear end 105 of the spacer nut 100 and configured to couple the spacer nut 100 to a battery spacer via a corresponding dovetail receiving slot on the battery spacer.

Some spacer nut embodiments may additionally include a dovetail receiving slot 117 configured to couple the spacer nut 100 to a battery spacer 150 via a corresponding dovetail pin 154 (as shown in FIG. 1C) on the battery spacer. Some spacer nut embodiments may include a dovetail receiving slot 117 but not a dovetail pin 110. It may be advantageous for a spacer nut 100 on the bottom of a multi-spacer nut configuration to lack the bottom dovetail pin 110 to provide a flat or substantially flat base to accommodate mounting. Similarly, some spacer nut embodiments may include the bottom dovetail pin 110 but not the top dovetail receiving slot 117. It may be advantageous for a spacer nut 100 on the top of a multi-spacer nut configuration to lack the top dovetail receiving slot 117 to provide a flat or substantially flat top, for a finished appearance or to prevent snagging on external materials.

FIG. 1B is a top view of a single spacer nut according to some embodiments. FIG. 1B shows a top view of the spacer nut 100 that is shown in FIG. 1A. As is illustrated in FIGS. 1A and 1B, the spacer nut 100 comprises a first side 106 and a second side 107 opposite the first side 106 along the vertical axis of the spacer nut 100. An opening 108 extends through the spacer nut 100 from the top surface 102 to the bottom surface 103 (FIG. 1A) near the front end 104 of the spacer nut 100. The spacer nut 100 further comprises an attaching member 109 protruding from the rear end 105 (FIG. 1A). The attaching member 109 includes a mounting hole 114 that is configured to facilitate coupling of the spacer nut 100 to an auxiliary structure. In some embodiments, the mounting hole 114 is surrounded by a raised serrated structure 113 configured to receive a corresponding structure of a common washer or lock washer component, or perhaps a corresponding structure integrated with an auxiliary structure (e.g., auxiliary structure 240 or 241 shown in FIGS. 2A-C). In operation, the attaching member 109 can stabilize the battery pack structure by coupling to the same receiving bore on another spacer nut in the same horizontal plane, via an auxiliary structure, such as 240 and 241 described herein.

Note that in some embodiments, the spacer nut 100 may have (i) a top dovetail receiving slot 117 but not a bottom dovetail pin 110, (ii) a bottom dovetail pin 110 protruding from the bottom surface 103 (FIG. 1A) of the spacer nut 100 and extending from approximately a midpoint 111 of the bottom surface 103 of the spacer nut 100, but not a top dovetail receiving slot 117, or (iii) both a top dovetail receiving slot 117 and a bottom dovetail pin 110.

FIG. 1C is a perspective view of a single battery spacer according to some embodiments. As illustrated, the battery spacer 150 comprises (i) several dovetail pins (including dovetail pin 154) and several receiving slots (including receiving slot 152) situated along the perimeter of the battery spacer 150 in an alternating configuration, and (ii) several openings (including opening 156), where each opening is configured to accommodate a particularly-sized battery. Although the example battery spacer shown in FIG. 1C has six dovetail pins, six receiving slots, and two openings for accommodating batteries, other battery spacer configurations may have more or fewer dovetail pins, receiving slots, and/or openings than the example shown in FIG. 1C.

In operation, the dovetail pin 154 on battery spacer 154 can be coupled to a corresponding dovetail receiving slot on a spacer nut, e.g., dovetail receiving slot 117 on spacer nut 100 (as shown in FIG. 1B). Similarly, the dovetail slot 152 on battery spacer 154 can be coupled to a corresponding dovetail pin on a spacer nut, e.g., dovetail pin 110 on spacer nut 100 (as shown in FIG. 1A).

FIG. 2A is a top view of a set of a four spacer nuts 201, 202, 203, and 204 arranged in a configuration to accommodate an auxiliary structure 240 according to some embodiments. The four spacer nuts are substantially similar to spacer nut 100 as shown in FIGS. 1A and 1B and set in a rectangular formation.

As shown, the first spacer nut 201 is substantially similar to spacer nut 100, the second spacer nut 202 is substantially similar to the spacer nut 100, the third spacer nut 203 is substantially similar to spacer nut 100, the forth spacer nut 204 is substantially similar to spacer nut 100. The first spacer nut 201, second spacer nut 202, third spacer nut 203, and fourth spacer nut 204 are arranged into a first horizontal configuration 200. In one example, the second spacer nut 202 and the third spacer nut 203 are coupled to a second battery spacer 235. The fourth spacer nut 204 and the first spacer nut 201 are coupled to a first battery spacer 230.

In the configuration shown in FIG. 2A, the first auxiliary structure 240 is attached to the first spacer nut 201 via a mounting hole 214 on an attaching member 209 first spacer nut 201. The first auxiliary structure 240 may be attached to the first spacer nut 201 via the mounting hole 214 in any one of several ways.

For example, in some embodiments, the first auxiliary structure 240 may have its own mounting hole that aligns with the mounting hole 214 on the first spacer nut 201 so that a pin, screw, bolt or similar attaching structure can be inserted through the corresponding mounting holes on the first auxiliary structure 240 and the first spacer nut 201. Any other attachment mechanism now known or later developed that is sufficient for aligning and/or mounting the first auxiliary structure 240 with the first spacer nut 201 could be used as well.

The second spacer nut 202, third spacer nut 203, and fourth spacer nut 204 are each also attached to the first auxiliary structure 240 in any manner similar to how the first spacer nut 201 is attached to the first auxiliary structure 240 as described above.

Figure 2B:
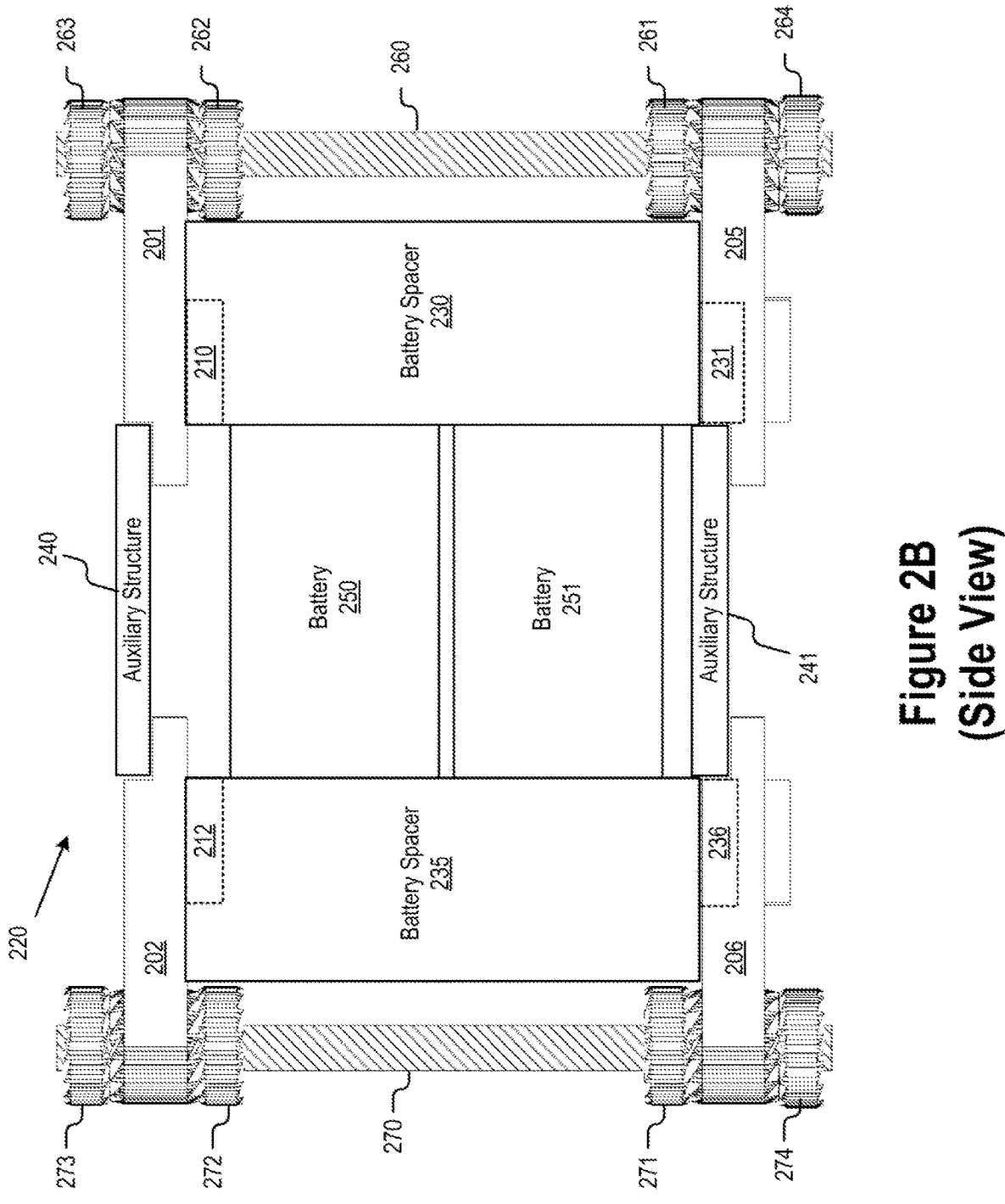
FIG. 2B is a side view of a set of four spacer nuts and two battery spacers arranged in a configuration that includes eight spacer nuts configured to accommodate two auxiliary structures according to some embodiments.

FIG. 2B is a side view of a set of four spacer nuts 201, 202, 205, and 206 arranged in a configuration that includes eight spacer nuts. Spacer nut 201 and spacer nut 202 in FIG. 2B are the same spacer nut 201 and spacer nut 202 shown in FIG. 2A.

Spacer nut 201 (FIGS. 2A, 2B), spacer nut 202 (FIGS. 2A, 2B), spacer nut 203 (FIG. 2A), spacer nut 204 (FIG. 2A), spacer nut 205 (FIG. 2B), and spacer nut 206 (FIG. 2B)— along with a seventh spacer nut (not shown) and an eighth spacer nut (not shown)—are configured to accommodate two auxiliary structures 240, 241 according to some embodiments in the eight spacer nut configuration 220.

As shown, the first auxiliary structure 240 is coupled to spacer nut 201 (FIGS. 2A, 2B) and spacer nut 202 (FIGS. 2A, 2B). The first auxiliary structure 240 is also coupled to spacer nut 203 (FIG. 2A) and spacer nut 204 (FIG. 2A).

The eight-spacer-nut configuration 220 is held together by four bolts. Two bolts (260, 270) of the four bolts are shown in FIG. 2B. The two other bolts are not shown from the side view perspective of FIG. 2B, but the two other bolts are arranged similarly to bolts 260 and 270. Spacer nut 201 is coupled to spacer nut 205 via a first bolt 260, and spacer nut 202 is coupled to spacer nut 206 via a second bolt 270.

The first bolt 260 is routed through the opening in spacer nut 201 (e.g., opening 108 shown in FIGS. 1A and 1B) and secured to the spacer nut 201 by component 263 and component 262. The first bolt 260 is also routed through the opening in spacer nut 205 (e.g., opening 108 shown in FIGS. 1A an 1B) and secured to the spacer nut 205 by components 261 and 264. In some embodiments that may have more than one eight spacer nut configuration 220, bolt 260 may (i) continue upward past component 263 and route through two more spacer nuts of a similar eight spacer nut configuration and/or (ii) continue downward past component 264 and route through two more spacer nuts of a similar eight spacer nut configuration. In some embodiments, the first bolt 260 extends at the bottom through a mounting surface (not shown) with one or more washers and/or nuts arranged to securely attach the bolt to the mounting surface.

The second bolt 270 is routed through the opening in spacer nut 202 (e.g., opening 108 shown in FIGS. 1A and 1B) and secured to the spacer nut 202 by component 273 and component 272. The second bolt 270 is also routed through the opening in spacer nut 206 (e.g., opening 108 shown in FIGS. 1A an 1B) and secured to the spacer nut 206 by components 271 and 274. In some embodiments that may have more than one eight spacer nut configuration 220, bolt 270 may (i) continue upward past component 273 and route through two more spacer nuts of a similar eight spacer nut configuration and/or (ii) continue downward past component 274 and route through two more spacer nuts of a similar eight spacer nut configuration. In some embodiments, the second bolt 270 extends at the bottom through a mounting surface (not shown) with one or more washers and/or nuts arranged to securely attach the bolt to the mounting surface.

Persons of skill in the art will recognize that the other two bolts (not shown) of the four bolts holding the eight spacer nut configuration 220 together are arranged similarly to the two bolts (260, 270) shown in FIG. 2B, except that the two other bolts (not shown in FIG. 2B) on the opposite side of the of the side view depicted in FIG. 2B.

In the example configuration 220 shown in FIG. 2B, spacer nut 202 is coupled to battery spacer 235 by inserting dovetail pin 212 of spacer nut 202 into a corresponding receiving slot of battery spacer 235 (e.g., a receiving slot similar to receiving slot 152 in FIG. 1C). Similarly, spacer nut 206 is coupled to battery spacer 235 by inserting dovetail pin 236 of battery spacer 235 into a corresponding receiving slot of spacer nut 206 (e.g., a receiving slot similar to receiving slot 117 in FIG. 1A). As shown, spacer nut 205 is coupled to battery spacer 230 using dovetail receiving slot 231. Similarly, spacer nut 201 is coupled to battery spacer 230 by inserting dovetail pin 210 of spacer nut 201 into a corresponding receiving slot of battery spacer 230 (e.g., a receiving slot similar to receiving slot 152 in FIG. 1C), and spacer nut 205 is coupled to battery spacer 230 by inserting dovetail pin 231 of battery spacer 230 into a corresponding receiving slot of spacer nut 205 (e.g., a receiving slot similar to receiving slot 117 in FIG. 1A).

The example configuration 220 in FIG. 2B also includes a first auxiliary structure 240 connected to spacer nuts 201 and 202, and a second auxiliary structure 241 connected to spacer nuts 205 and 206. The first auxiliary structure 240 is connected to spacer nut 202 in the same manner(s) that the first auxiliary structure 240 is connected to spacer nut 201 as described above with reference to FIG. 2A. Also, the second auxiliary structure 241 is connected to spacer nuts 205 and 206 in the same manner that the first auxiliary structure 240 is connected to spacer nuts 201 and 202. Some embodiments may include both auxiliary structures 240 and 241 as shown in FIG. 2B. However, other embodiments may include the first auxiliary structure 240 but not the second auxiliary structure 241 whereas other embodiments may include the second auxiliary structure 241 but not the first auxiliary structure 240. In some embodiments, the first auxiliary structure 240 and second auxiliary structure 241 further comprise at least one of (i) circuit board, (ii) a thermal insulating material, or (iii) other functionality as the application may require.

The example battery spacer 230 and example battery spacer 235 are configured to hold four batteries, two of which are visible in the side view illustrated in FIG. 2B: battery 250 and battery 251. The other two batteries are not visible in the side view of FIG. 2B. In other examples, the battery spacers 230, 235 may be configured to hold one, two, three, or four batteries, or more batteries, as required for the application.

In operation, the configuration 220 is sturdy and rigid at least in part because of the combination of (i) the bolts (260, 270), (ii) the components (261, 262, 263, 264, 271, 272, 273, 274) attaching the spacer nuts (201, 202, 205, 206) to the bolts (260, 270), (iii) the dovetail joints formed when the pins (210, 213) of the spacer nuts (201, 202) are inserted into their corresponding receiving slots of the battery spacers (230, 235), and (iv) the dovetail joints formed when the pins (231, 236) of the battery spacers (230, 235) are inserted into their corresponding receiving slots of the spacer nuts (205, 206). In embodiments that also include one or both of the first auxiliary structure 240 and the second auxiliary structure 241, the auxiliary structures (240, 241) may add further structural rigidity to the configuration 220.

Figure 2C:
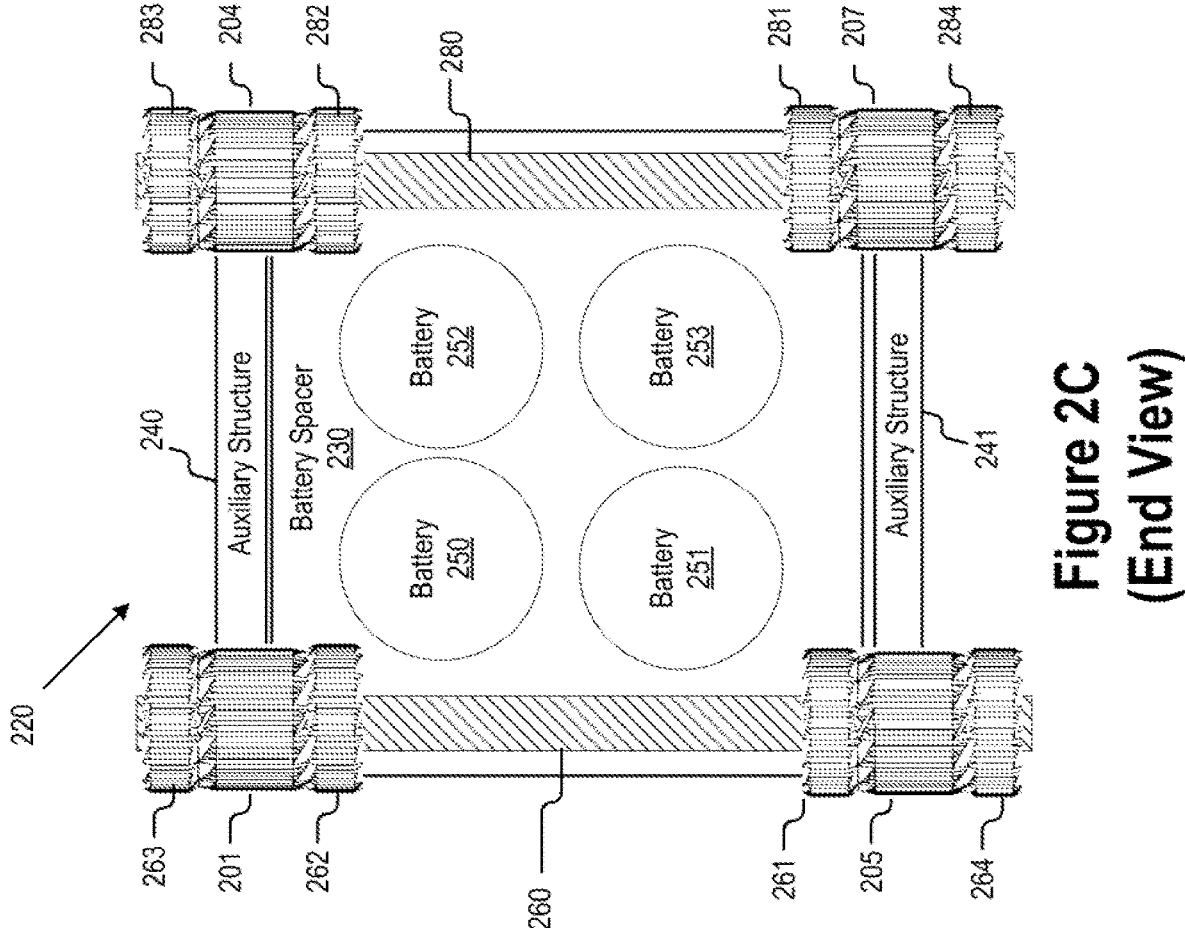
FIG. 2C is an end view of a set of four spacer nuts and two battery spacers arranged in a configuration that includes eight spacer nuts configured to accommodate two auxiliary structures according to some embodiments.

FIG. 2C is an end view of a set of four spacer nuts 201, 204, 205, 207 arranged in the configuration 220 that includes the eight spacer nuts configured to accommodate two auxiliary structures (240, 241) according to some embodiments. Spacer nut 201 and spacer nut 205 in FIG. 2C are the same spacer nut 201 and spacer nut 205 shown in FIG. 2A, and spacer nut 204 in FIG. 2C is the same as spacer nut 204 in FIG. 2A. Similarly, auxiliary structures 240 and 241 are the same auxiliary structures 240, 241 shown in FIGS. 2A and 2B.

As mentioned with reference to FIG. 2B, the eight spacer nut configuration 220 is held together by four bolts. Two bolts (260, 280) of the four bolts are shown in FIG. 2C in the same way that two bolts (260, 270) of the four bolts were shown in FIG. 2B. The other two bolts of the four bolts in the configuration are not shown in the end view illustrated in FIG. 2C.

As shown and described with reference to FIG. 2B and shown also in FIG. 2C, spacer nut 201 is coupled to spacer nut 205 via bolt 260. And as shown in FIG. 2C, spacer nut 204 is coupled to spacer nut 207 via bolt 280.

As described with reference to FIG. 2B, bolt 260 is routed through the opening in spacer nut 201 (e.g., opening 108 shown in FIGS. 1A and 1B) and secured to the spacer nut 201 by component 263 and component 262. Bolt 260 is also routed through the opening in spacer nut 205 (e.g., opening 108 shown in FIGS. 1A an 1B) and secured to the spacer nut 205 by components 261 and 264. In some embodiments that may have more than one eight spacer nut configuration 220, bolt 260 may (i) continue upward past component 263 and route through two more spacer nuts of a similar eight spacer nut configuration and/or (ii) continue downward past component 264 and route through two more spacer nuts of a similar eight spacer nut configuration.

Similar to bolt 260, bolt 270 is routed through the opening in spacer nut 204 (e.g., opening 108 shown in FIGS. 1A and 1B) and secured to the spacer nut 204 by component 283 and component 282. Bolt 270 is also routed through the opening in spacer nut 207 (e.g., opening 108 shown in FIGS. 1A an 1B) and secured to the spacer nut 207 by components 281 and 284. In some embodiments that may have more than one eight spacer nut configuration 220, bolt 270 may (i) continue upward past component 283 and route through two more spacer nuts of a similar eight spacer nut configuration and/or (ii) continue downward past component 284 and route through two more spacer nuts of a similar eight spacer nut configuration.

Persons of skill in the art will recognize that the other two bolts of the four bolts holding the eight spacer nut configuration 220 together are arranged similarly to the two bolts (260, 280) shown in FIG. 2C, except that the two other bolts (not shown in FIG. 2C) on the opposite side of the of the end view depicted in FIG. 2C.

In the example embodiment illustrated in FIG. 2C, battery spacer 230 holds four batteries: battery 250, battery 251, battery 252, and battery 253. In other embodiments, battery spacers can be configured to hold one, two, three, four (or more) batteries.

Some embodiments have been described with reference to particular features and functions. In view of the disclosure herein, it will be apparent to those skilled in the art that various modifications and variations can be made to the embodiments disclosed and described herein without departing from the scope or spirit of the invention(s). One skilled in the art will recognize that the disclosed features and functions may be used singularly, in any combination, or omitted based on the requirements and specifications of a given application or design.

What is claimed is:

1. An apparatus comprising a first spacer nut, wherein the first spacer nut comprises:
    a top surface along a longitudinal axis of the first spacer nut;
    a bottom surface opposite the top surface along the longitudinal axis of the first spacer nut;
    a front end along a lateral axis of the first spacer nut;
    a rear end opposite the front end along the lateral axis of the first spacer nut;
    a first side along a vertical axis of the first spacer nut;
    a second side opposite the first side along the vertical axis of the first spacer nut;
    an opening extending from the top surface to the bottom surface near the front end of the first spacer nut;
    an attaching member protruding from the rear end of the first spacer nut and configured for coupling the first spacer nut to a first auxiliary structure;
    a dovetail pin protruding from the bottom surface of the first spacer nut and extending from approximately a midpoint of the bottom surface of the first spacer nut to approximately the rear end of the first spacer nut and configured to couple the first spacer nut to a first battery spacer via a corresponding dovetail receiving slot on the first battery spacer.

2. The apparatus of claim 1, wherein the opening extending from the top surface to the bottom surface near the front end of the first spacer nut is configured to receive a bolt.

3. The apparatus of claim 1, wherein a region surrounding the opening on the top surface comprises a first raised serrated structure configured to receive a corresponding serrated locking structure of a first component, and wherein a region surrounding the opening on the bottom surface comprises a second raised serrated structure configured to receive a corresponding serrated locking structure of a second component.

4. The apparatus of claim 1, further comprising the first auxiliary structure coupled to the first spacer nut via the attaching member.

5. The apparatus of claim 1, wherein the first auxiliary structure comprises at least one of a circuit board, a thermal insulating material, or a conductor layer.

6. The apparatus of claim 1, further comprising:
    a second spacer nut substantially identical to the first spacer nut;
    a third spacer nut substantially identical to the first spacer nut,
    a fourth spacer nut substantially identical to the first spacer nut; and
    wherein the first spacer nut, second spacer nut, third spacer nut, and fourth spacer nuts are arranged into a first horizontal configuration wherein:
    the first spacer nut is coupled to the first battery spacer;
    the second spacer nut is coupled to the first battery spacer;
    the third spacer nut is coupled to a second batter spacer; and
    the fourth spacer nut is coupled to the second battery spacer.

7. The apparatus of claim 6, further comprising a fifth spacer nut, wherein the fifth spacer nut comprises:
    a top surface along a longitudinal axis of the fifth spacer nut;
    a bottom surface opposite the top surface along the longitudinal axis of the fifth spacer nut;
    a front end along a lateral axis of the fifth spacer nut;
    a rear end opposite the front end along the lateral axis of the fifth spacer nut;
    a first side along a vertical axis of the fifth spacer nut;
    a second side opposite the first side along the vertical axis of the fifth spacer nut;
    an opening extending from the top surface to the bottom surface near the front end of the fifth spacer nut;
    an attaching member protruding from the rear end of the fifth spacer nut and configured for coupling the fifth spacer nut to a second auxiliary structure; and
    a dovetail receiving slot along the top surface and extending from approximately the midpoint of the fifth spacer nut to approximately the rear end of the fifth spacer nut and configured to couple the fifth spacer nut to the first battery spacer via a corresponding dovetail pin on the first battery spacer.

8. The apparatus of claim 7, further comprising:
    a sixth spacer nut substantially identical to the fifth spacer nut,
    a seventh spacer nut substantially identical to the fifth spacer nut;
    an eighth spacer nut substantially identical to the fifth spacer nut; and
    wherein the fifth spacer nut, sixth spacer nut, seventh spacer nut, and eighth spacer nuts are arranged into a second horizontal configuration wherein:
    the fifth spacer nut is coupled to the first battery spacer;

the sixth spacer nut is coupled to the second battery spacer;

the seventh spacer nut is coupled to the first battery spacer;

the eight spacer nut is coupled to the second battery spacer.

9. The apparatus of claim 8, wherein the first horizontal configuration is coupled to the second horizontal configuration via bolts.

\* \* \* \* \*